US 6,680,800 B1

United States Patent
Schreiber et al.

(10) Patent No.: US 6,680,800 B1
(45) Date of Patent: Jan. 20, 2004

(54) DEVICE FOR SYMMETRIZING THE RADIATION EMITTED BY LINEAR OPTICAL TRANSMITTERS

(75) Inventors: Peter Schreiber, Jena (DE); Thilo Von Freyhold, Jena (DE)

(73) Assignee: unique-m.o.d.e. AG (DE)

( * ) Notice: Subject to any disclaimer, the term of this patent is extended or adjusted under 35 U.S.C. 154(b) by 285 days.

(21) Appl. No.: 09/744,922

(22) PCT Filed: Oct. 10, 2000

(86) PCT No.: PCT/EP00/09967
§ 371 (c)(1),
(2), (4) Date: Jan. 30, 2001

(87) PCT Pub. No.: WO01/27686
PCT Pub. Date: Apr. 19, 2001

(30) Foreign Application Priority Data

Oct. 11, 1999 (DE) .......................................... 199 48 889

(51) Int. Cl.$^7$ .......................... G02B 27/10; G02B 3/00; G02B 9/00; G02B 13/18; G02B 3/06; H01S 3/091; H01S 3/094
(52) U.S. Cl. ........................ 359/618; 359/623; 359/626; 359/627; 359/652; 359/710; 372/75
(58) Field of Search ................................. 359/618, 622, 359/559, 653, 623, 626, 627, 710, 75

(56) References Cited

U.S. PATENT DOCUMENTS

| | | | |
|---|---|---|---|
| 5,513,201 A | * | 4/1996 | Yamaguchi et al. .......... 372/75 |
| 5,784,203 A | * | 7/1998 | Beckmann .................. 359/618 |
| 6,151,168 A | * | 11/2000 | Goering et al. ............. 359/623 |

FOREIGN PATENT DOCUMENTS

| | | |
|---|---|---|
| DE | 196 45 150 A1 | 10/1996 |
| DE | 196 45 150 | 10/1996 |
| DE | 197 43 322 A1 | 9/1997 |
| DE | 198 00 590 A1 | 1/1998 |
| DE | 198 20 154 | 5/1998 |
| DE | 198 20 154 A1 | 5/1998 |
| DE | 100 15 245 A1 | 3/2000 |
| EP | 1 059 713 A2 | 12/2000 |
| WO | WO 95/15510 | 6/1995 |
| WO | WO 96/02013 | 1/1996 |

OTHER PUBLICATIONS

English translation of the International Preliminary Exam Report issued on Jan. 23, 2002, PCT/EP00/09967.

* cited by examiner

Primary Examiner—Hung Xuan Dang
Assistant Examiner—Joseph Martinez
(74) Attorney, Agent, or Firm—Young & Basile, P.C.

(57) ABSTRACT

A device is proposed to symmetrize the radiation from one or from several linear optical emitters. The device possesses per emitter 1, 1a, 1b a cylindrical lens optical unit 2, 2a, 2b with one or more cylindrical lenses, which collimate each light beam in the y-direction, where by rotating at least one of the cylindrical lenses around the z-axis or by providing a discontinuous diffracting element, each light beam is diffracted at a different diffraction angle in the y-direction. The device additionally contains a director-collimator optical unit 3, which collimates each light beam in the x-direction and diffracts at different diffraction angles so that the main beams of the individual light beams in the x-direction converge at a specified distance from the emitter and run parallel in the y-direction. Finally, the device has a redirecting optical unit 4 which compensates for the diffraction of the light beam in the x-direction caused by the director-collimator optical unit 3.

34 Claims, 9 Drawing Sheets

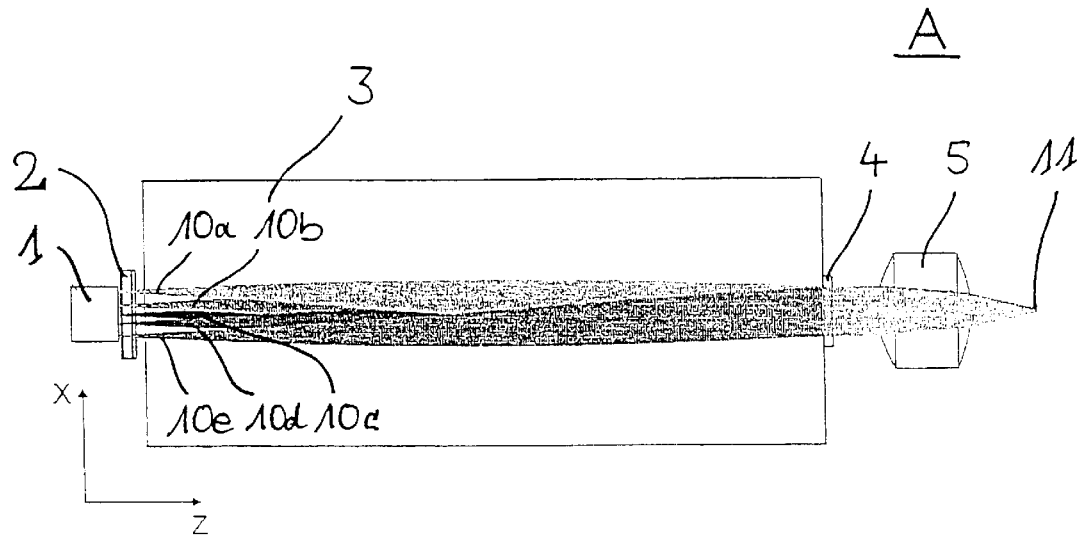
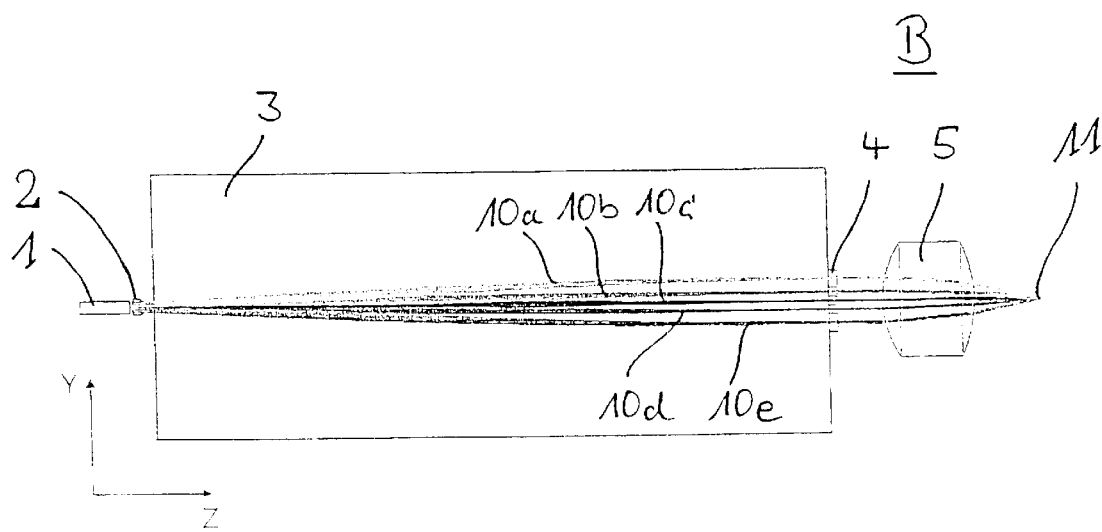
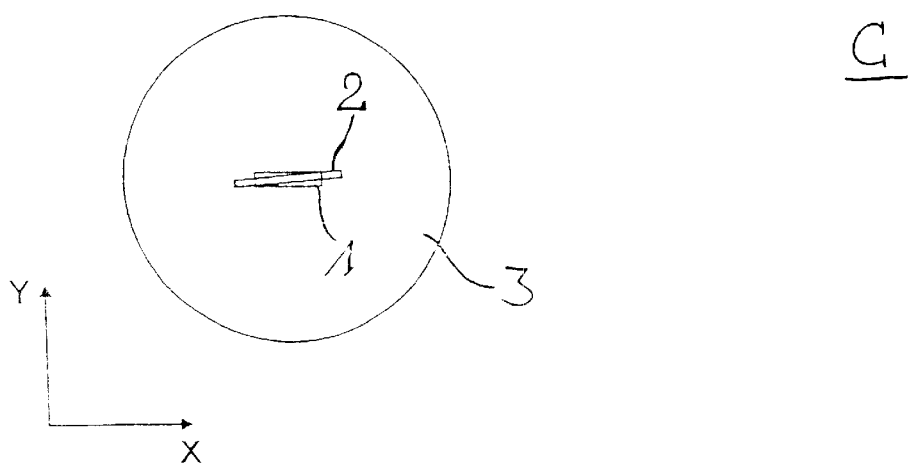
Fig. 1

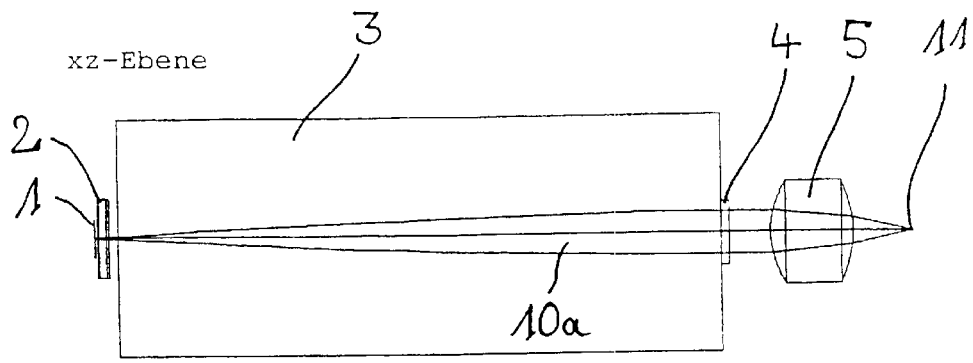
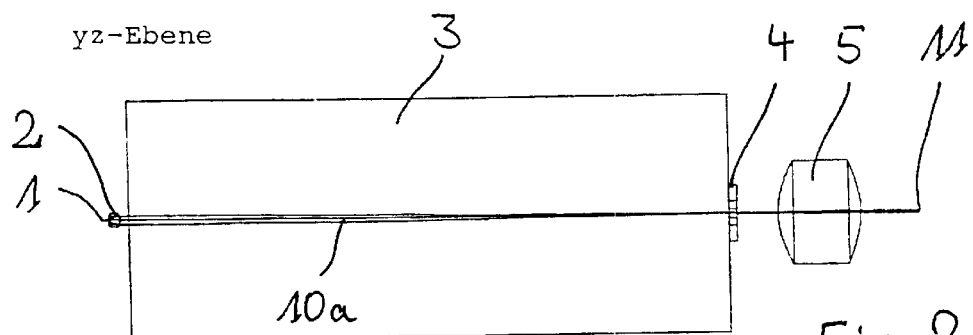
Fig. 2
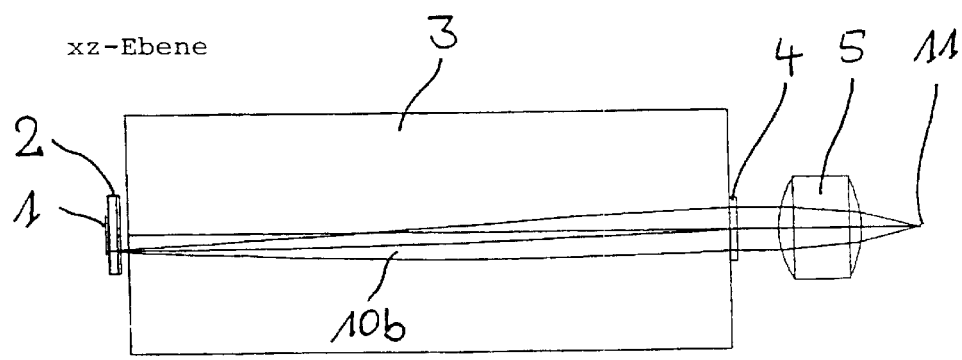
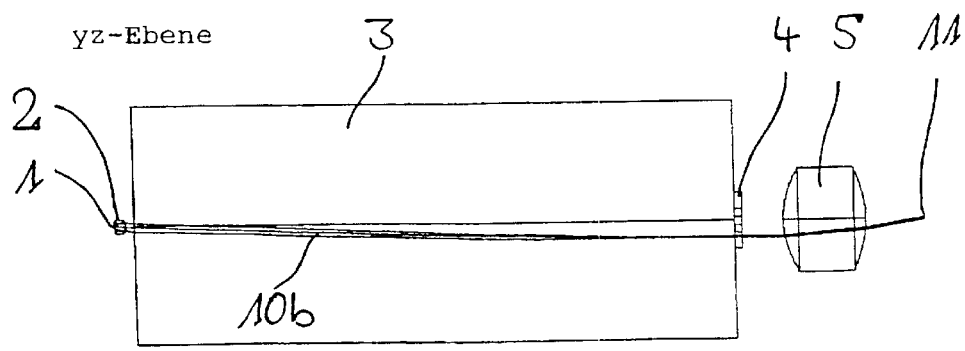
Fig. 3

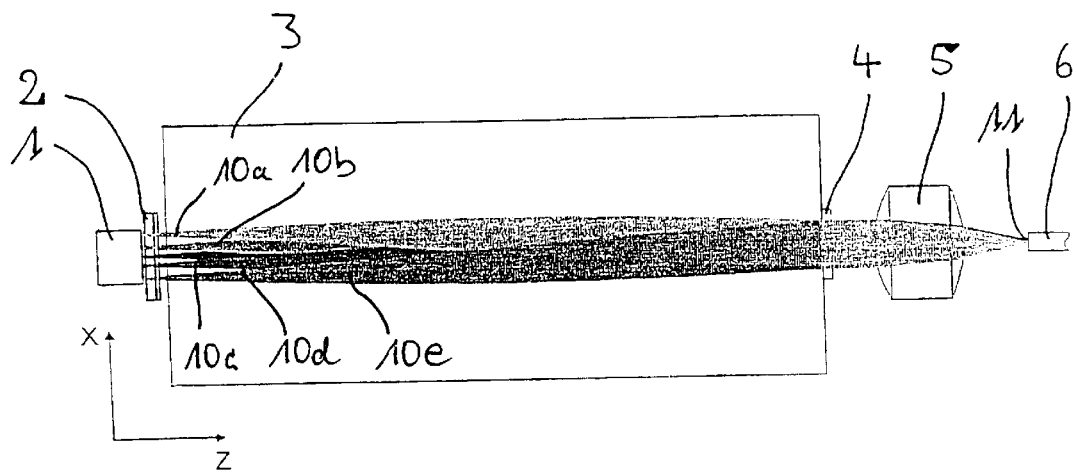
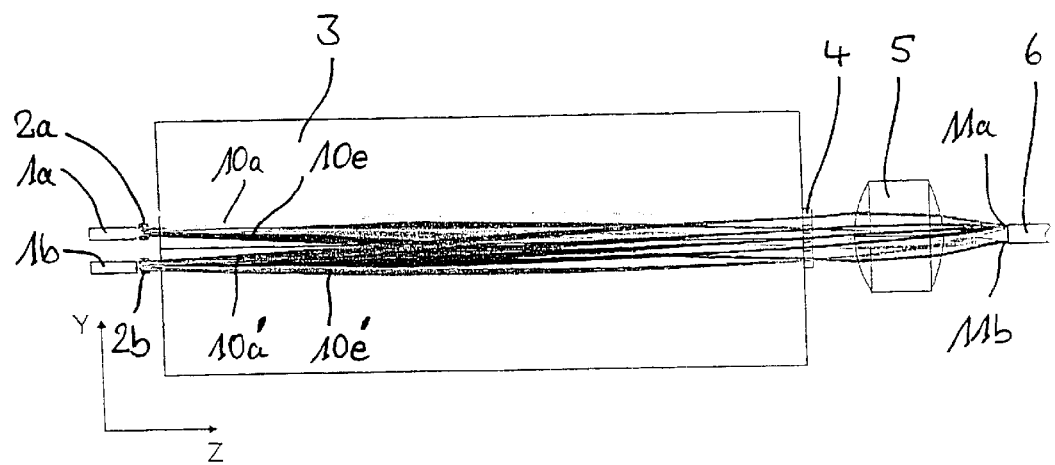
Fig. 5

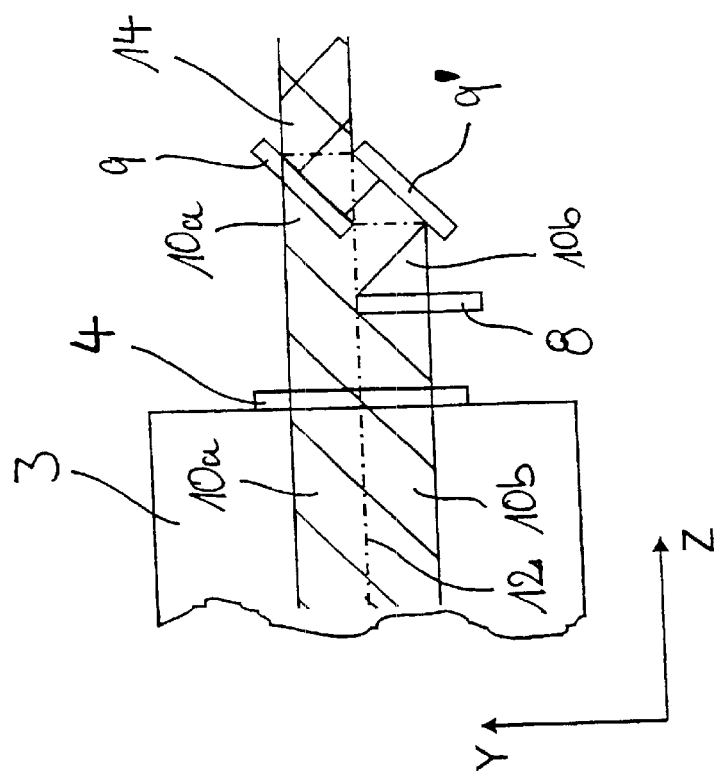
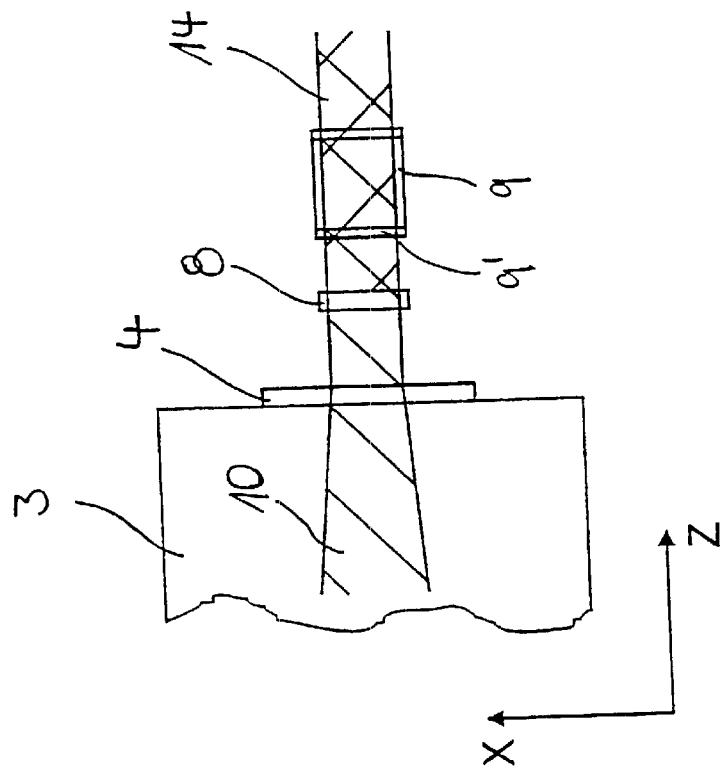
Fig. 10

DEVICE FOR SYMMETRIZING THE RADIATION EMITTED BY LINEAR OPTICAL TRANSMITTERS

BACKGROUND OF THE INVENTION

The invention concerns a device to symmetrize the radiation of one or several linear optical emitters, in particular wideband laser diodes, whose radiation can be described as light beams with telecentric chief rays infinitesimally tightly packed in an x-direction perpendicular to its direction of emission, or to a main optical axis z, and whose radiation is asymmetrical with respect to the x-direction and a y-direction perpendicular to the x-direction and to the z-direction.

In the case of asymmetric optical emitters, the problem occurs that the output radiation is also asymmetrical. For a large number of applications of optical emitters of this kind it is desirable to have an output that is as symmetrical as possible. For this reason, devices to symmetrize the radiation of asymmetrical optical emitters are needed.

From DE 196 45 150 a device to symmetrize the radiation of a light source built up of a plurality of separate emitters is known. In the case of the light source, it is a laser diode bar which contains a plurality of individual laser diodes. The symmetrizing device consists of a cylindrical lens rotated about the optical axis, a directional optical unit to diffract the light beams from the individual laser diodes, a redirecting optical unit to compensate for the diffraction of the directional optical unit, and a subsequent collimating optical unit.

From DE 198 20 154 a device to symmetrize the radiation of one or several laser diode bars is known, which comprises a cylindrical lens optical system, two continuous angle transform elements with intervening Fourier transform arrays to redirect the light beam and a focusing device. The disadvantage is the high cost of producing the angle transform array.

In addition to the laser diode bars known from DE 196 45 150 and DE 198 20 154, what are known as wideband laser diodes, which are laser diodes with a single, wide emitter, are becoming increasingly important. The geometric dimensions of the radiating surface of the emitter is typically in a range between 50 $\mu m \times 1$ $\mu m$ up to about 500 $\mu m \times 1$ $\mu m$.

The output radiation of these types of wideband laser diodes is extremely asymmetrical. In a first plane (slow axis), which is formed from one axis in the direction of the broad dimension of the emitting surface and one axis in the direction of emission, the divergence of the output radiation corresponds to a numerical aperture of about 0.1. In a second plane (fast axis) perpendicular to the first plane, the output radiation has a considerably greater divergence, corresponding to a numerical aperture of about 0.5.

Because of the different divergences and dimensions in the two planes, the beam quality of the output radiation, and consequently the focusability in the two planes, is very different. The beam product, which is defined as the product of the emitting surface and the divergence of the output radiation, can be used as the measure of the beam quality. The ratio of the beam products of slow axis to fast axis, depending on the width of the emitting surface, is in the range up to about 1:100 for wideband laser diodes. The use of wideband laser diodes consequently requires the use of optical systems to symmetrize the radiation.

From WO 96/02013 a device to symmetrize the radiation of wideband laser diodes is known which, with the aid of a prism system, splits the already collimated output beam of a wideband laser diode along its broad dimension into several individual beams and stacks these beams one above the other. The disadvantage in the case of this symmetrizing device is the complexity of the prism array and the absence of any potential for miniaturization.

From WO 95/15510 another device to symmetrize the radiation of wideband laser diodes is known, in which the output radiation of the laser diode passes through a system of two highly reflective surfaces barely tilted towards each other in such a way that at the output of the device the result is a symmetrized reconfiguration of the laser diode beam. The disadvantage with this device is the high cost of adjusting the entire system and the great expense that would be associated with miniaturizing the system.

SUMMARY OF THE INVENTION

Starting from the disadvantages of the prior art, the object of the invention is to provide a device to symmetrize the radiation of linear optical emitters, consisting of micro-optic components which are relatively simple to manufacture, and which is amenable to economical miniaturization. Furthermore, beam density losses associated with symmetrizing should be kept as low as possible, and good imaging characteristics should be ensured. The object is furthermore to provide arrays and applications for devices of this kind.

The output radiation of one or several linear optical emitters, i.e. in-line emitters, can be described by a linear array of individual light beams with telecentric chief rays, lying infinitesimally close together at least in one or several light beam groups, in a perpendicular direction to the direction of emission and thus also in a direction x perpendicular to an optical main axis of the optical unit z. A single light beam group can have beams from each one of the emitters, if necessary in a device with several emitters and/or individual beams from several emitters. Consequently there can be a space between each of the light beam groups in the x-direction and/or y-direction.

Under the invention, a device to symmetrize the output radiation is proposed, which has a cylindrical lens optical system, which can contain one or several cylindrical lenses per emitter or possibly for several emitters jointly. The cylindrical lenses bring about a collimation of each beam in the y-direction. At least one of the cylindrical lenses can be rotated about the direction of emission, in order to diffract each beam at different angles in the y-direction. As an alternative to rotating at least one of the cylindrical lenses, the diffraction in the y-direction can be achieved by means of a separate discontinuous diffracting element.

The device under the invention further contains a director-collimator optical unit positioned along the main optical axis z, which collimates each beam in the x-direction and diffracts them at different diffraction angles in the x-direction and the y-direction. The director-collimator optical unit can also be positioned in a direction perpendicular to the main optical z-axis, e.g. x- or y-direction, offset to the main optical axis. The diffraction takes place in such a way that the chief rays of the individual beams of one beam group converge in the x-direction at a specified distance from the emitter(s) and run parallel in the y-direction.

Finally, the device under the invention has a redirecting optical unit, which can also be positioned along the z-axis. This diffracts the light beam in the x-axis. Advantageously it compensates for the diffraction of the light beam in the x-direction caused by the director-collimator optical unit, as the result of which the beam product is reduced in the xz-plane, while it is increased in the yz-plane. The asymmetrical output radiation of the linear emitter is thus transformed into largely collimated radiation with an approximately rectangular or square cross section. The beam products in the yz-plane and in the xz-plane are conformed in this way.

The device under the invention to symmetrize the radiation of a linear optical emitter, compared with the known devices, has the advantage that it consists only of assemblies which can be manufactured and miniaturized economically. The device is also relatively uncomplicated to set up. Compared with the known devices to symmetrize the radiation of a laser-diode bar, the invention shows a clear reduction in aberrations, which can be attributed to the superior arrangement of collimating, directional and redirecting optical devices.

The present invention comprises, in addition to the devices to symmetrize radiation, arrays of several devices of this kind, where the radiations emanating from one of the devices are superposed on one another, polarization-coupled or wavelength-coupled. For this, a λ/2 delay plate can be positioned following the particular redirecting optical unit in at least one of the optical paths as a polarization-rotating element. Furthermore, the particular partial rays of the individual devices are superposed on one another by means of a mirror element. The mirror element can be polarization-selective or wavelength-selective. In similar fashion, it is also possible to superpose individual light beam groups from a single device under the invention on one another, polarization-coupled or wavelength-coupled.

These kinds of arrays of several devices under the invention are particularly suitable for generating specific properties of the received conformed beam, for example, a non-polarized output beam, although the output radiation of individual wideband laser diodes is polarized. The intensity of the light beam received in the end can also be varied by this means.

The device under the invention and the arrays of such devices under the invention can be used directly to generate a desired radiation, or also indirectly to pump lasers, in particular in the fields of printing and photographic technology, for micromaterial processing, in the field of medical technology, in telecommunications technology or in lighting and display technology. They also have an application in the field of analytics.

Additional advantages and embodiments of the invention can be seen from the figures and the design samples presented below.

BRIEF DESCRIPTION OF THE DRAWINGS

FIG. 1 shows the device under the invention in the xz and yz-plane with the optical paths for each;

FIG. 2 shows the optical paths in both planes for a single light beam located in the middle of the radiating surface of the emitter;

FIG. 3 shows the optical paths in both planes for a single beam located in the fringe area of the radiating surface of the emitter;

FIG. 5 shows the device under the invention for coupling a stack of linear emitters to an optical fiber in the xz and yz-plane with the optical paths in each case;

FIG. 10 shows a device under the invention with polarization-coupled superposition of individual light beams.

DESCRIPTION OF THE PREFERRED EMBODIMENT

Figure 4:
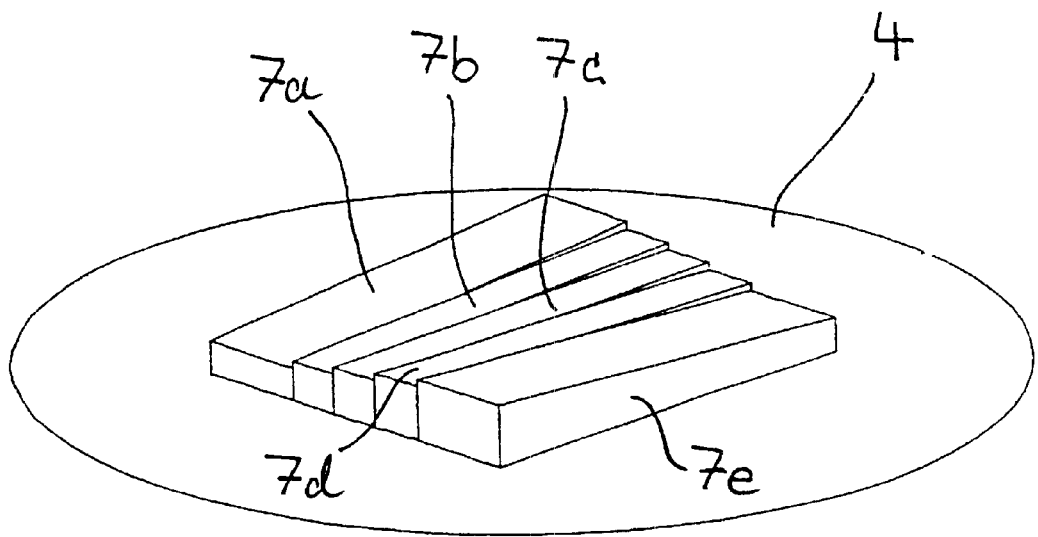
FIG. 4 shows the schematic structure of a redirector.

In all the figures the same references numerals are used for the same elements.

FIG. 1 shows an initial design sample of the device to symmetrize the radiation of a linear optical emitter 1. In this design sample, the emitter 1 is a wideband laser diode, which has an emitting surface with a width of 500 μm and a height of 1 82m. The radiation of this wideband laser diode 1 can be thought of as being composed of individual beams with telecentric chief rays which lie infinitesimally close together in the x-direction. In FIG. 1 and the rest of the figures only a few light beams or light beam groups, here identified as 10 or 10a through 10e, are shown in each instance as examples of the light beams or light beam groups. The divergence of the entire output beam in the xz-plane shown in FIG. 1A is typically about 6°0 (half acceptance angle), and in the yz-plane shown in FIG. 1B it is typically more than 30° (half acceptance angle). Instead of the wideband laser diode, other optical emitter can also be used, such as for example, a stretched glow wire with a non-symmetrical radiating surface.

A cylindrical optical unit is positioned parallel to the broad dimension of the wideband laser diode 1, whose direction of emission in this example coincides with the main optical axis z. The cylindrical optical unit 2 includes a microcylinder lens to collimate the light beam in the yz-plane. The microcylinder lens 2 is rotated by an angle of about 2° about the optical axis (z-axis) in order to diffract the individual light beams 10a through 10e at different angles of radiation respective to the optical axis (z-axis). The tilting of the cylindrical lens is shown in FIG. 10, which represents the xy-plane, where only the projection of the laser diode 1, the cylindrical optical unit 2 and the director-collimator optical unit are drawn in. The inclination of the optical unit 2 about the z-axis relative to the laser diode 1 is shown exaggerated, since in practice it is only about 2°. The diffraction in the yz-plane has only a minor affect on the output radiation of the laser diode 1 in the xz-plane.

Here, as below, the drawings in the xz-plane, in the yz-plane or the xy-plane are not meant to be, or portray, sections but projections of the arrays and optical paths in this plane.

In the case of the microcylinder lens 2 we are dealing with a bi-aspheric microcylinder lens with a diameter of about 150 μm and a focal length of about 100 μm. The lens is constructed in such a way that it has sufficiently large isoplanism. That means that even the out-of-center fringe areas of the output radiation caused by the inclination of the lens in the y-direction are imaged practically aberration-free. Instead of the aspheric microcylinder lens, for example, a spherical cylinder lens, a fiber optic lens, a gradient-optical lens or a Fresnel cylindrical lens can be used. A multi-component cylindrical optical unit which includes two or more of the above described cylindrical lenses can also be used. To diffract the beams in the y-direction, at least one cylindrical lens component can be rotated around the z-axis.

As an alternative to tilting the microcylinder lens 2 about the optical axis, the diffraction of the beams in the y-direction can be achieved by providing a discontinuous diffracting element in addition to the cylindrical lens optical devices. The diffracting element, which is not shown in FIG. 1, can be placed ahead of, between or after the cylindrical optical devices 2, and can contain a field of prisms, diffracting gratings, diffracting gradient-optical areas, cylindrical lenses or mirrors.

Furthermore, the cylindrical lens optical unit 2 can include one more segmentation element not shown in FIG. 1, which causes the light beams to split up into individual groups in the x-direction. The segmenting element can, for example, be a field of cylindrical lenses or cylindrical lens telescopes. The segmentation in the x-direction results in a homogenization of the output radiation from the emitter at the expense of the beam product in the xz-plane.

In FIG. 1, a director-collimator optical unit 3 is positioned in the z-direction behind the cylindrical lens optical unit 2 along the main optical axis, which is configured as a gradient-optic cylindrical lens (SELFOC SLW 3.0, length 7.5 mm). As can be seen from FIGS. 2 and 3 (at the top in each case), the individual light beams are collimated by the director-collimator element 3 in the xz-plane and deflected in such a way that the chief rays of the light beams converge in the xz-plane in that plane in which the redirector optical unit 4 is located. In the x-direction the primary beams therefore lie exactly above one another in the plane of the redirector optical unit 4.

In addition, the director-collimator element 3 causes the individual light beams, as can be seen in FIG. 2 and FIG. 3 (in each case at the bottom), to be deflected in the yz-plane in such a way that the chief rays of the individual light beams run parallel to one another behind the director-collimator element 3 in the yz-plane.

In the plane of the redirector optical unit 4, which in the design sample is mounted on the output-side face of the SELFOC lens 3, the resulting width of the collimated light beam in the xz-plane is about 550 $\mu$m. In the yz-plane, the resulting width in this position of the individual collimated light beams, for the above quoted distances and the quoted focal length of the microcylinder lens, is about 50 $\mu$m. The inclination of the microcylinder lens 2 at an angle of about 2° about the optical axis causes an offset $\Delta y$ in the yz-plane of about ±250 $\mu$m with respect to the optical axis of the light beams located at the edge of the emitting surface of the wideband laser diode 1. So in the plane of the redirector optical unit 4 a symmetrical aggregate beam is created with a beam cross section of about 550 $\mu$m×550 $\mu$m.

The director-collimator element 3 can include, for example, a second or several lenses or lens groups and/or cylindrical lenses instead of a gradient-optical cylindrical lens. For example, spherical or aspheric planoconvex or biconvex lenses can be considered. Gradient-optical lenses or Fresnel lenses can also be used. The diffracting element mentioned in conjunction with the cylindrical optical unit 2 for diffracting the light beam in the y-direction can be positioned after the front lens or lens group in the z-direction in the case of a director-collimator element 3 composed of two or several lenses or lens groups. The diffracting element is then located between the lenses or lens groups of the director-collimator element 3.

The redirecting optical unit 4 shown in FIG. 1 diffracts groups of adjacent light beams 10a through 10e in such a way that the different angles of incidence caused by the director-collimator element 3 in the xz-plane are corrected. As shown in FIG. 4, the redirecting optical unit 4 has several diffraction areas 7a through 7e positioned linearly in the yz-plane with different diffraction angles, which in each case are determined by the focal length of the director-collimator element 3. In the present design example, the redirecting optical unit 4 has five diffraction areas 7a through 7e, with diffraction angles of about −3.7°, −1.8°, 0°, +1.8° and 3.7°. The width of the diffraction areas 7a through 7e in the xz-plane is at least 0.8 mm in each case. In the yz-plane the three inner diffraction areas 7b through 7d have a height of 100 $\mu$m, and the two outer diffraction areas 7a and 7e expediently have a greater height of 200 $\mu$m. The redirector optical unit 4 is built up of a microstructured prism field. An alternative embodiment of the redirecting optical unit 4 provides for configuring it from a field of blazed gratings, a field of diffracting, gradient-optic areas, lenses or a mirror field. If the redirecting optical unit 4 consists of a field of individual optical elements, the light beams are split in the y-direction into individual groups. As the result of this segmenting of the in-line emitter output radiation into individual groups of light beams split off in the y-direction, the light product can be reduced in the xz-plane.

A reduction of the light product is also possible if the redirecting optical unit 4 contains a cylindrical lens or cylindrical lens optical unit rotated about the z-axis or a free-form surface. In this case, of course, there is no segmenting of the light beams in the y-direction. Nevertheless, the result is a symmetrized and focusable output radiation behind the redirecting optical unit 4.

To improve the imaging properties of the device it is possible to install a field of cylindrical lenses or cylindrical telescopes effective in the y-direction ahead and/or after the redirector optical unit 4.

As can be seen from FIG. 2 and FIG. 3, the central rays of the groups of adjacent light beams 10a through 10e run parallel to the optical axis behind the redirector optical unit 4 in each case. If all groups are observed together, the result after the redirector optical unit 4 is a largely collimated aggregate beam with an approximately rectangular or square cross section.

In FIG. 1 a focusing optical unit 5 is positioned after the redirecting optical unit 4, which can consist, for example, of one spherical or aspheric planoconvex or biconvex lens, a gradient optical lens, of one or of two crossed spherical or aspheric cylindrical lenses or of one lens group, and which focuses the beams. In the design sample a Geltech model 350200 aspheric lens with a focal length of 1.14 mm is used. It generates a beam diameter of about 40 $\mu$m at f 11. The divergence of the beams running farthest from the optical axis corresponds to a numerical aperture of about 0.4.

The device in accordance with FIG. 1 can be used with minor modifications to symmetrize the radiation from several linear emitters which are offset in the x-direction and/or in the y-direction. The individual emitters can be spaced at a distance from about 0.1 mm up to several mm.

FIG. 5 shows a design sample of one such device to symmetrize the radiation from several wideband laser diodes 1a, 1b. As sketched out in FIG. 5, with a device of this type a stack of wideband laser diodes 1a, 1b arranged offset in the y-direction can be coupled to an optical fiber 6. Similarly conceivable is coupling to several separate fibers or to a splayed fiber bundle. The restriction to only two laser diodes 1a, 1b instead of several laser diodes in the design sample FIG. 5 is only for greater clarity. Alternatively or additionally, the laser diodes 1a, 1b can be offset to each other in the x-direction.

In front of each of the two wideband laser diodes 1a, 1b superposed in the y-direction, there is a microcylinder lens 2a, 2b rotated about the optical axis in accordance with the design model shown in FIG. 1. The director-collimator optical unit 3, the redirecting optical unit 4 and the focusing optical unit 5 can also be configured in the same way as described in the preceding design sample. With an array of this kind, the positions of the primary rays of all the light beams, in spite of the off-center arrangement of the wideband laser diodes 1a, 1b, remain unchanged relative to the director-collimator optical unit 3 in the plane of the redirecting optical unit 4, compared with a centered laser-diode arrangement.

An embodiment of the device shown in FIG. 5 provides for a diffracting element to be positioned after each cylindrical lens optical unit 2a, 2b, which diffracts in the xz-plane. In this way the output radiation of the individual laser diodes in the plane of the redirecting optical unit 4 is split in the x-direction. By means of a diffracting unit placed ahead of or behind the redirecting optical unit 4, which has a suitable field of diffracting elements, it is possible to achieve a diffraction of the particular output radiation of a laser diode 1a, 1b in the x-direction and/or in the y-direction. This allows the beam spot of each laser diode 1a. 1b to be positioned anywhere in the yz-plane and/or the xz-plane.

The combination of redirecting optical unit 4 and diffracting unit can be replaced by a single diffracting element.

Both the diffracting element positioned after each cylindrical lens optical unit 2a, 2b as well as the diffracting unit positioned ahead of or after the redirecting optical unit 4 can be made up of a field of prisms, diffracting gratings, diffracting gradient optic areas, lenses or mirrors.

Behind the focusing optical unit 5, the beam spots 11a, 11b of the wideband laser diodes arrayed above one another have an offset in the yz-plane, in accordance with the imaging relationship of the device shown in FIG. 1, of about 74 μm in the design sample, with a wideband laser diode 1a, 1b together with microcylinder lens 2a, 2b off-center by about 200 μm in the yz-plane relative to the director-collimator optical unit 3. The beam spots 11a, 11b are launched together into the end of an optical fiber with a matching diameter following the focusing optical unit 5. In the design sample a fiber with a 200 μm core diameter is used. Another variation provides for launching the beam spots 11a, 11b separately into the ends of several fibers or the individual fibers of a splayed fiber bundle.

Figure 6:
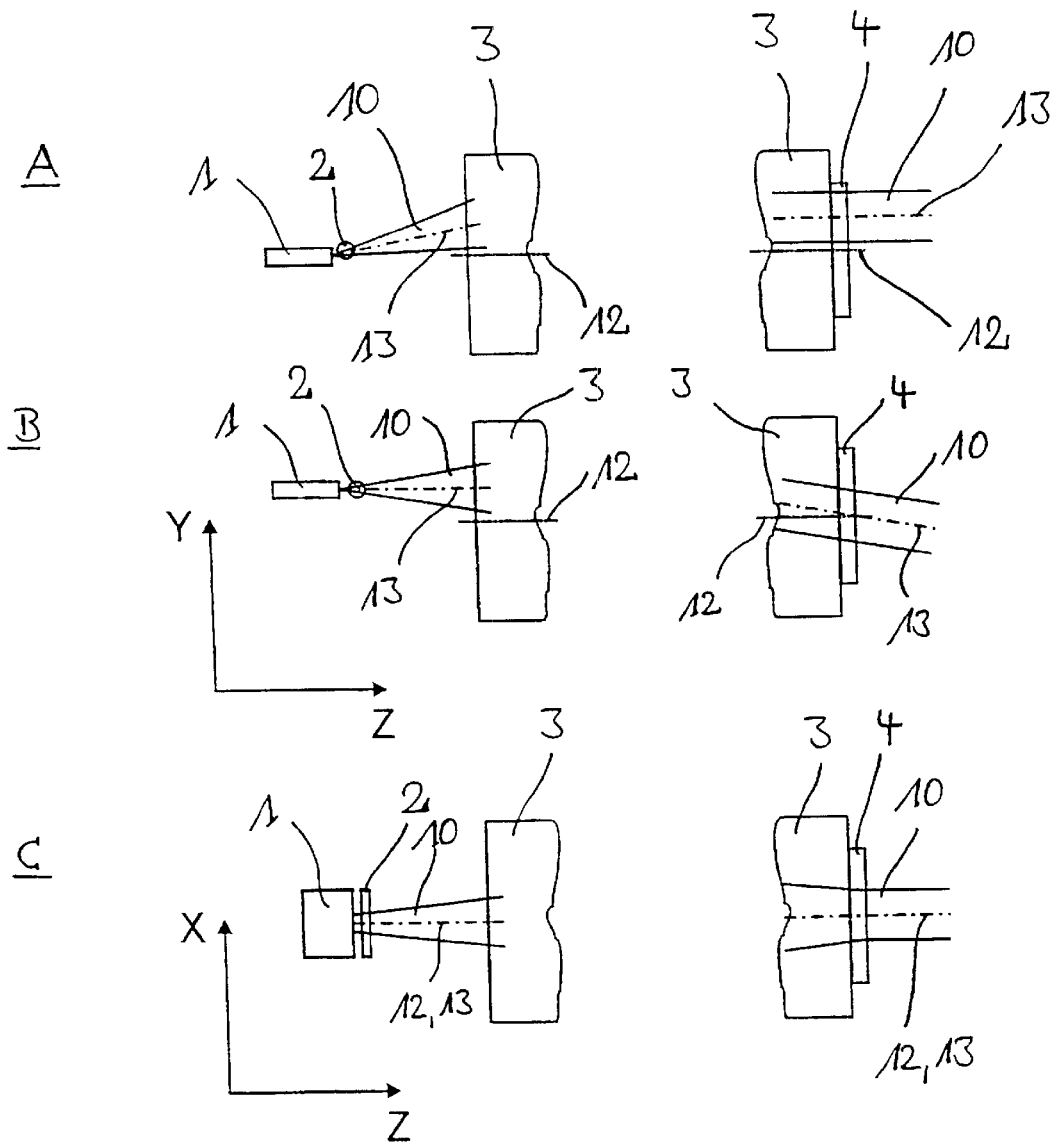
FIG. 6 shows the effect of the directional-collimating optical unit on a beam group impinging at an angle or an offset to the main optical axis.

FIG. 6 shows the effect of the director-collimator optical unit 3 on a light beam group impinging at an angle or at an offset to the main optical axis 12. FIGS. 6A and 6B show in each case different light beam groups, of which one light beam group 10 shown in FIG. 6A is displaced upwards through a cylindrical lens optical unit 2 offset in the y-direction in FIG. 6A by a wide band laser diode lying in the main optical axis 12, or of which another light beam group 10 shown in FIG. 6B originates from an wideband laser diode 1 located offset in the y-direction relative to the main optical axis in FIG. 6B.

The effect of the director-collimator optical unit 3 in FIG. 6A is that the light beam group 10 impinging at an angle on the director-collimator optical unit 3 with its axis of radiation 13 runs parallel to the optical main axis when it leaves the director-collimator optical unit 3, but in the y-direction runs offset to it.

In FIG. 6B it can be seen that the light beam group 10, which impinges on the director-collimator lens 3 with its axis of radiation parallel although offset to the main optical axis 12, leaves the director-collimator optical unit 3 and the redirecting 4 with its axis of radiation 13 at an angle to the main optical axis 12.

In FIG. 6C the situation is shown in the xz-plane, i.e. in the plane which is formed from the main optical axis 12 and the x-axis perpendicular to it. In both cases of FIGS. 6A and 6B, the result in the projection of the particular light beam group onto the xz-plane, shown in FIG. 6C, is the same image from FIG. 6C.

Figure 7:
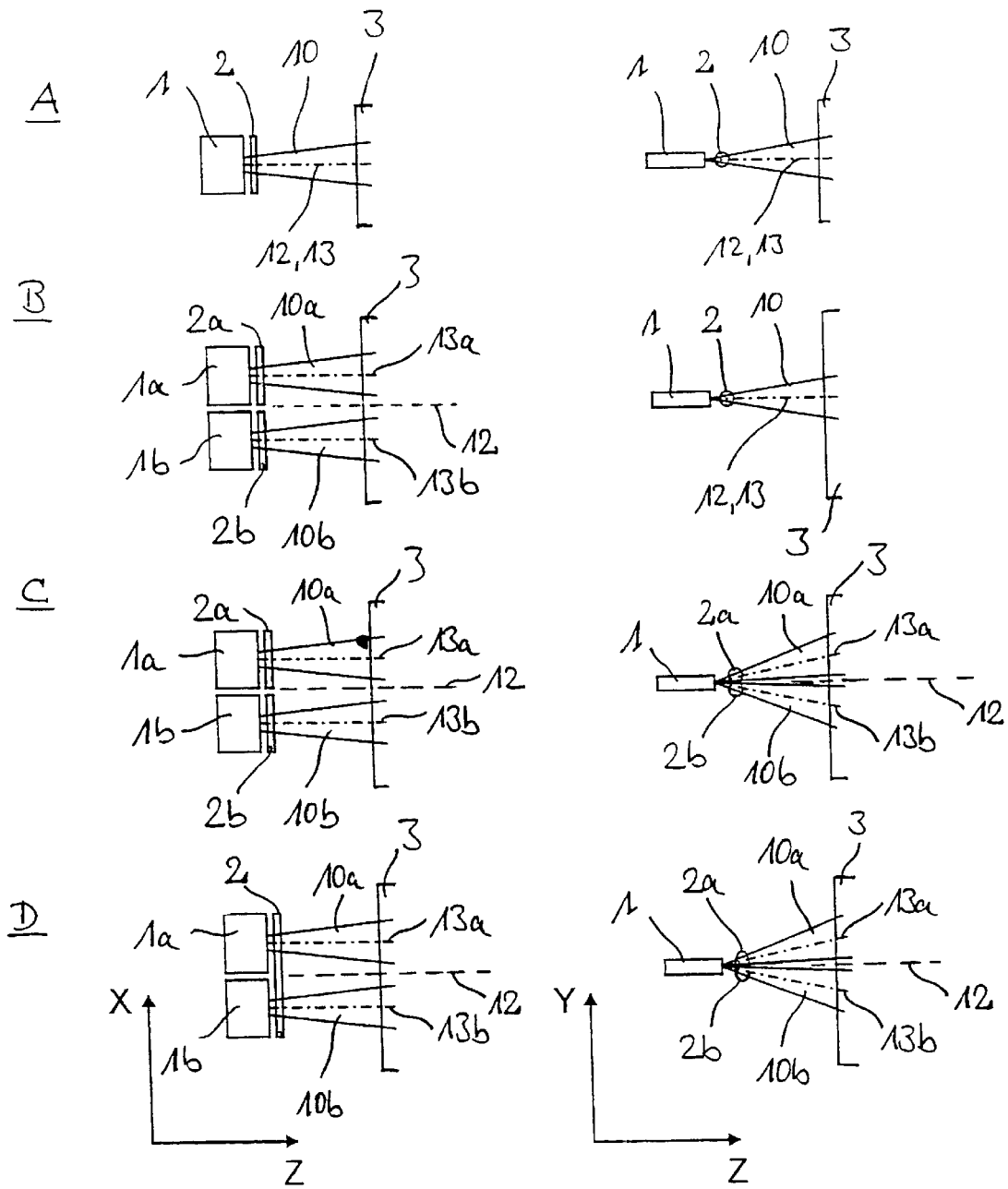
FIG. 7 shows several examples of arrays of linear optical emitters in the xz-plane.

FIG. 7 shows possible arrangements of emitters 1, 1a, 1b with respect to the cylindrical lenses 2, 2a, 2b and the director-collimator optical unit 3, where in each case on the left side a projection in the xz-plane, and on the right side a projection in the yz-plane is shown.

In FIG. 7A a wideband emitter 1 is equipped with a cylindrical lens 2, so that the direction of emission 13 of the light beam group 10 coincides with the main optical axis 12.

In FIG. 7 two emitters 1a, 1b are positioned next to each other in the x-direction, which each have their own cylindrical lens optics 2a and 2b. The directions of emission 13a and 13b of the two emitters 1a and 1b are parallel to the optical main axis, but offset to it in the x-direction.

In FIG. 7C two emitters 1a and 1b are similarly positioned next to each other in the x-direction, where each of the emitters has its own cylindrical lens system 2a or 2b. Here too, the directions of emission 13a and 13b of the light beam groups 10a and 10b from the respective emitters 1a and 1b are parallel in the xz-plane, but offset to the main optical axis 12. The two cylindrical lenses 2a and 2b, however, are positioned offset to each other in the y-direction, so that the light beam group 10a is diffracted upwards, and the light beam group 10b is diffracted downwards with respect to the y-direction. Thus, the directions of emission 13a and 13b run at an angle to the main optical axis in the yz-plane.

FIG. 7D shows an arrangement with two emitters 1a and 1b, which have a common cylindrical lens 2. In the xz-plane the directions of emission 13a and 13b of the two light beam groups 10a and 10b from the respective emitters 1a or 1b run parallel, but offset to the main optical axis 12.

The cylindrical lens 2 is positioned rotated in FIG. 7D, as in all preceding FIGS. 7A through 7C, about the z-axis (see also FIG. 1C), so that an area 2a of the cylindrical lens 2 located in front of the emitter 1a is diffracted upwards, and an area 2b of the cylinder lens 2, which is front of the emitter 1b is deflected downwards in the y-direction. Consequently, the two light beam groups 10a and 10b are emitted with their axes of radiation 13a and 13b offset in the –yz-plane at an angle vis-a-vis the optical main axis 12.

The present examples are limited to two emitters in order to make the illustrations simpler and more comprehensible, but the arrays can be expanded to several emitters, for example, to a laser diode bar. The emitters, and where applicable the cylindrical lenses, can additionally be stacked in any combination, not only in the x-direction but also in the y-direction.

Figure 8:
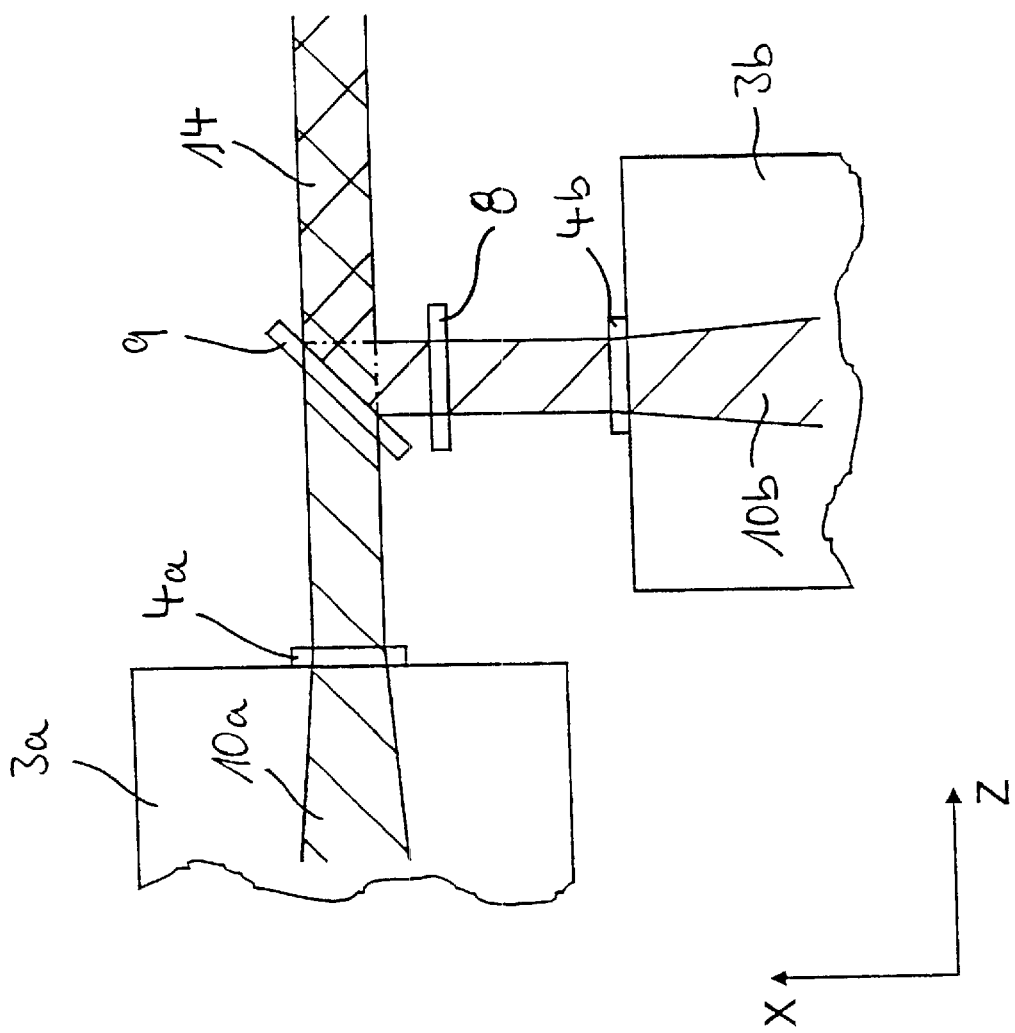
FIG. 8 shows an array under the invention.

FIG. 8 shows an arrangement of two devices under the invention positioned perpendicular to each other in the xz-plane, where only the last part in each case of the optical path with the director-collimator lenses 3a and 3b and the redirecting optical systems 4a and 4b are shown, and the emitters and cylindrical lens optical systems are not shown. In the example presented, which shows only a variation of the devices under the invention, without excluding all other devices under the invention shown and claimed thus far, the light beam groups 10a and 10b are collimated by the director-collimator lenses 3a and 3b in the xz-plane and made parallel in the xz-plane through the redirecting optical systems 4a or 4b. The light beam group 10b then passes through a polarization-rotating element 8 and is coupled with the light beam group 10a through a polarization-selective mirror element to form an aggregate beam 14. Consequently a polarization coupling of two light beam groups generated and symmetrized by devices under the invention takes place here. The superposition does not take place until after the redirecting lens.

Figure 9:
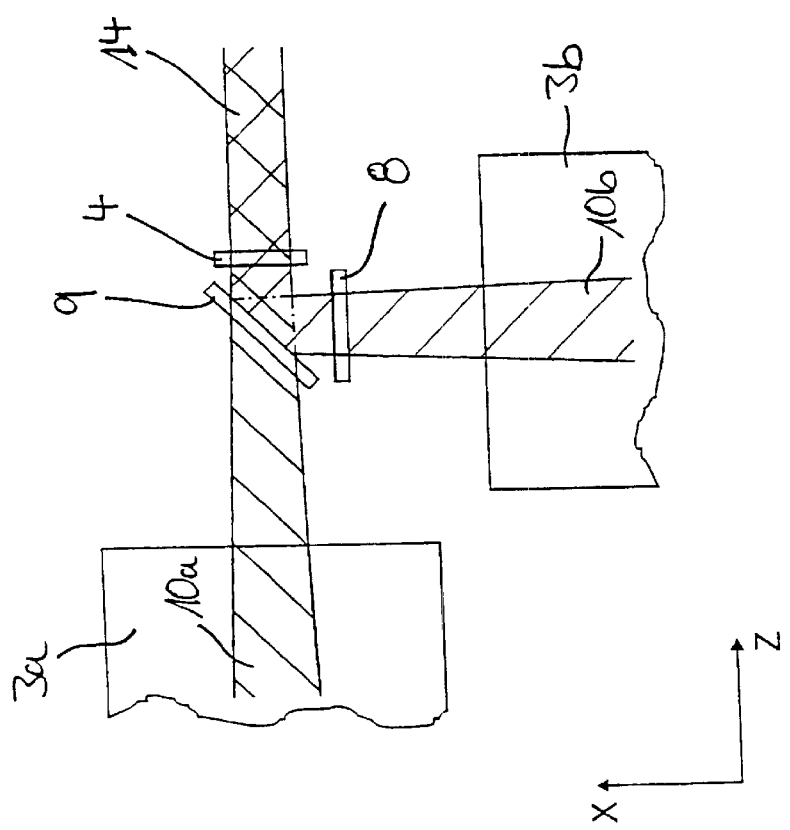
FIG. 9 shows an additional array under the invention.

FIG. 9 shows an arrangement corresponding to the arrangement in FIG. 8, where however the redirecting optics 4a and 4b are no longer provided, so that the light beam groups 10a and 10b are collimated onto the polarization-selective mirror element. The light beam group 10b still passes through a polarization-rotating element 8 between the director-collimator lens 3b and the mirror element 9. The light beam groups 10a and 10b coupled to each other by the mirror element 9 to form an aggregate beam 14 then jointly pass through a redirecting lens 4. So the two devices 10a and 10b under the invention share a common redirecting lens 4, where the superposition of the partial beams takes place before the redirecting lens 4.

If wideband laser diodes are used as emitters in this example, the light beam groups 10a and 10b are polarized linearly in the same direction. The direction of polarization of the light beam group 10b is consequently rotated advantageously by means of the polarization-rotating element 8, for example a λ/2 delay plate, by 90°. By means of the polarization-selective mirror element 9, the light beam group 10a is superposed on the light beam group 10b. For this the polarization-rotating element 8 can be located at any position in the optical path in front of the mirror element 9.

In another example, it is possible to orient the two devices under the invention in such a way that the polarization directions of the two linearly polarized light beam groups 10a and 10b are perpendicular to one another. In this case the polarization-rotating element 8 is not required.

In another example, the light beam groups 10a and 10b in FIGS. 8 or 9 can have different wave lengths. Then a superposition of the light beam groups 10a and 10b, corresponding to the arrangements shown in FIG. 8 and FIG. 9, can be carried out by means of a wavelength-selective mirror element 9, where the light beam groups 10a and 10b do not necessarily have to be polarized linearly and even the polarization-rotating element 8 can be dispensed with.

In FIG. 8 and FIG. 9 arrangements are shown which have two devices under the invention. Of course, by means of appropriate arrangements, several light beam groups from several devices under the invention can be coupled together by means of several polarization-selective and/or wavelength-selective mirror elements.

FIG. 10 shows a further example of a device under the invention, where individual light beam groups 10a, 10b from the same aggregate beam 10 are polarization-coupled or wave-length coupled to each other.

In FIG. 10, a polarization rotating element 8 is inserted after the redirecting lens 4 in the optical path of the light beam group 10. Immediately afterwards, the light beam group 10b strikes a non-polarization-selective mirror element 9' and is deflected to an additional polarization-selective element 9. This polarization-selective mirror element 9 stands in the optical path of the light beam group 10a and allows it to pass, while it reflects the light beam group 10b. In so doing, an aggregate beam 14 is generated by the mirror element 9, which is composed of the light beam group 10a and the light beam group 10b, which is rotated in its polarization.

In FIG. 10, the aggregate beam 10 ideally has a rectangular cross section after the redirection lens 4 and is composed of the two light beam groups 10a and 10b from one or several linear optical emitters. In the present example, the illustration was limited to two light beam groups 10a and 10b, where, however, several light beam groups can be superposed on one another.

The second light beam group is then superposed on the polarization direction of the light beam group 10b by means of the polarization-rotating element 8 and the polarization-selective mirror element 9.

In a further example, the light beam groups 10a and 10b can possess different wave lengths, where, in this case, the mirror element 9 can be a wavelength-selective mirror element, and the light beam groups 10a and 10b do not have to be polarized linearly. The polarization-rotating element 8 in this example can also be dispensed with. Consequently, in this example an aggregate beam is generated by coupling two light beam groups with different wave lengths. A combination of polarization and wavelength superposition of several light beam groups is possible in all the preceding examples in FIGS. 8 through 10 following the principles laid out.

In additional examples, interrupted emitters can be used instead of several different emitters, which emit light beam groups spatially separated from each other.

In all the examples shown, the redirecting lens 4 is positioned in the main optical axis 12. The redirecting lens 4 can, however, also be positioned offset to the main optical axis or tilted about the x-axis and/or y-axis, in order to balance the optical path.

The device under the invention and the arrangement under the invention of several devices is suitable for direct use as well as for indirect use, for example, for pumping lasers, in the fields of printing and photographic technology, micro-material processing, medical technology, telecommunications technology, illumination and display technology and analytics.

What is claimed is:

1. A device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical, comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction, a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction.

2. Device in accordance with claim 1, characterized in that the redirecting optical unit is designed so that the redirecting optical unit compensates for the diffraction of the light beam in the x-direction caused by the director-collimator optical unit.

3. Device in accordance with claim 1, characterized in that the diffracting element is a discontinuous diffracting element and is positioned in one of the front of, between and behind the cylindrical lens element.

4. Device in accordance with claim 1, characterized in that the diffracting element contains a field of at least one of prisms, diffracting gratings, diffracting gradient-optic areas, cylindrical lenses and mirrors.

5. Device in accordance with claim 1, characterized in that the diffraction angle envisaged in the y-direction either only increases or only decreases in the x-direction.

6. Device in accordance with claim 1, characterized in that the cylindrical lens optical unit continues to include a segmenting element which causes the light beam to be split into individual groups in the x-direction.

7. Device in accordance with claim 6, characterized in that the segmenting element is a field of one of cylindrical lenses and cylindrical lens telescopes.

8. Device in accordance with claim 1, characterized in that the director-collimator optical unit contains a gradient-optic cylindrical lens.

9. Device in accordance with claim 1, characterized in that the director-collimator optical unit contains at least one of lenses, cylindrical lenses, and lens groups.

10. Device in accordance with claim 9, characterized in that the diffracting element is positioned after the director-collimator optical unit with respect to the z-direction of one of the front lens and lens group.

11. Device in accordance with claim 1, characterized in that the redirecting optical unit contains at least one of a field of prisms, diffracting gratings, diffracting gradient-optic areas, lenses and mirrors.

12. Device in accordance with claim 1, characterized in that the redirecting optical unit is one of a cylindrical lens rotated about the z-axis, a cylindrical lens optical unit, and an element with a free-form surface.

13. Device in accordance with claim 1, characterized in that a field of one of cylindrical lenses effective in the y-direction and cylindrical lens telescopes is positioned behind the redirecting optical unit.

14. Device in accordance with claim 1, characterized in that a diffraction unit is positioned ahead of or after the redirecting optical unit, which diffracts the particular light beam groups from the emitters independently of one another in at least one of the x-direction and the y-direction.

15. Device in accordance with claim 14, characterized in that the device contains a diffracting element which replaces the redirecting optical unit and the diffracting unit allocated to the redirecting optical unit.

16. Device in accordance with claim 1, characterized in that at least one of the emitters is a laser diode bar, consisting of an array of linear optical laser diode emitters.

17. Device in accordance with claim 1, characterized in that the radiation immediately after the redirecting optical unit has a rectangular or square cross section.

18. Device in accordance with claim 1, characterized in that behind or in front of the redirecting optical unit a device is located for at least one of polarization coupling and wavelength coupling of individual light beam groups.

19. Use of device in accordance with claim 1 for one of direct application and for pumping lasers, in particular in the fields of printing and photographic technology, micromaterial processing, medical technology, telecommunications technology, lighting and display technology and analytics.

20. Device in accordance with claim 1, wherein the linear optical emitter is a wideband laser diode.

21. A device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical, comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction.

a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction, wherein at least two emitters positioned offset in at least one of the x-direction and the y-direction are provided.

22. Device in accordance with claim 21, characterized in that at least two cylindrical lens optics are provided to simultaneously symmetrize the radiation from the at least two emitters positioned offset in at least one of the x-direction and the y-direction, wherein one of the cylinder lens optics is allocated to each emitter.

23. Device in accordance with claim 21, characterized in that an additional diffracting element is positioned after each cylindrical lens optical unit, which diffracts the particular light beam groups from the individual emitters after the cylindrical lens optics in such a way that the particular light beam groups in the plane of the redirecting optical unit are separated from each other in at least one of the x-direction and the y-direction.

24. Device in accordance with claim 23, characterized in that one of the additional diffracting element and the diffracting unit contains at least one of a field of prisms, diffracting gratings, diffracting gradient-optic areas, lenses and mirrors.

25. A device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical, comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction, a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction, wherein at least two emitters are provided, which are positioned around at least one of the x-axis and y-axis rotated opposite to each other.

26. A device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction, a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction, wherein the cylindrical lenses assigned to the individual emitters are offset to one another in the y-direction.

27. A device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical, comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction.

a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction, wherein the device includes a focusing optical unit positioned behind the directing optical unit and the focusing optical unit contains one of a spherical and aspheric lens, a gradient-o-tic lens, a Fresnel lens, a cylindrical lense positioned next to each as a focusing lens field.

28. Device in accordance with claim 27, characterized in that at least one optical fiber is positioned behind the focusing optical unit.

29. Device in accordance with claim 27, characterized in that the focusing optical unit contains a combination of the spherical, aspheric, gradient-optic, Fresnel, and cylindrical lenses positioned next to each as a focusing lens field.

30. Device in accordance with claim 27, characterized in that a fiber bundle spread into individual fibers is positioned behind the focusing optical unit.

31. Array of several devices to symmetrize the radiation from at least one linear optical emitter in a device for symmetrizing the radiation from at least one linear optical emitter defined by an arrangement of light beams with telecentric chief rays lying infinitesimally close together in at least one light beam group in an x-direction perpendicular to a main optical axis z, and whose radiation in reference to the x-direction and a y-direction perpendicular to the x-direction and to the z-direction is asymmetrical, comprising:

a cylindrical lens optical unit positioned after the at least one emitter having at least one cylindrical lens, said cylindrical lens optical unit collimating each light beam in the y-direction, wherein by one of rotating at least one of the cylindrical lenses about a direction of emission of the emitter and providing a diffracting element, one of each light beam and each light beam group is diffracted at different angles in the y-direction.

a director-collimator optical unit positioned ahead of the at least one emitter and along the main optical axis z, said director-collimator optical unit collimating each of the at least one light beam in the x-direction and diffracts said at least one light beam at different angles in the x-direction and the y-direction, so that principal rays of the individual light beams from each light beam group in the x-direction converge at a specified distance from the at least one emitter and run parallel to each other in the y-direction, and a redirecting optical unit located after the director-collimator optical unit, which diffracts the light beams in the x-direction, characterized in that the device is positioned in the direction of emission ahead of a common redirecting optical unit or after the specific redirecting optics for at least one of polarization coupling and wavelength coupling of the radiation of the individual devices with each other, wherein the devices for symmetrizing in the at least one of the x-direction and in the y-direction of one of the devices are rotated towards one another in the y-direction.

32. Array in accordance with claim 31, characterized in that the devices for symmetrizing in at least one of the x-direction and in the y-direction of one of the devices are located next to each other in the same orientation.

33. Array in accordance with claim 31, characterized in that for at least two of the symmetrizing devices a common redirecting optical unit is positioned in the radiation direction after at least one of the device for polarization coupling and the device for wavelength coupling.

34. Use of the array in accordance with claim 31 for one of direct application and for pumping lasers, in particular in the fields of printing and photographic technology, micromaterial processing, medical technology, telecommunications technology, lighting and display technology and analytics.

* * * * *